(12) United States Patent
Jahan et al.

(10) Patent No.: US 7,609,787 B2
(45) Date of Patent: Oct. 27, 2009

(54) RECEPTION OF A SIGNAL MODULATED ACCORDING TO A MULTILEVEL CODING TECHNIQUE

(75) Inventors: Bruno Jahan, Tinteniac (FR); Pierrick Louin, Rennes (FR)

(73) Assignee: TDF, Paris (FR)

( * ) Notice: Subject to any disclaimer, the term of this patent is extended or adjusted under 35 U.S.C. 154(b) by 726 days.

(21) Appl. No.: 10/529,570

(22) PCT Filed: Oct. 1, 2003

(86) PCT No.: PCT/FR03/02878

§ 371 (c)(1),
(2), (4) Date: Oct. 28, 2005

(87) PCT Pub. No.: WO2004/032397

PCT Pub. Date: Apr. 15, 2004

(65) Prior Publication Data

US 2006/0140302 A1    Jun. 29, 2006

(30) Foreign Application Priority Data

Oct. 1, 2002    (FR) .................................. 02 12158

(51) Int. Cl.
*H04L 5/12*    (2006.01)
*H04L 27/06*    (2006.01)
*H03M 13/03*    (2006.01)

(52) U.S. Cl. ...................... 375/341; 375/262; 714/794; 714/795

(58) Field of Classification Search ................. 375/261, 375/262, 264, 265, 340, 341; 714/792, 794, 714/795

See application file for complete search history.

(56) References Cited

U.S. PATENT DOCUMENTS 6,581,182 B1 * 6/2003 Lee .......................... 714/795

6,898,248 B1 * 5/2005 Elgamal et al. ............. 375/259
7,046,975 B2 * 5/2006 Golitschek Edler Von Elbwart et al. ............................ 455/205

(Continued)

FOREIGN PATENT DOCUMENTS

EP        0 540 232 A2    5/1993
WO    WO 01/67617 A2    9/2001

OTHER PUBLICATIONS

Cusak, "Error Control Codes for QAM Signalling," Electronics Letter, Jan. 1984, vol. 20., No. 2, pp. 62-63.

Sayegh, "A Class of Optimum Block Codes in Signal Space," IEEE Transactions on Communications, vol. Comm.-34, No. 10, Oct. 1986, pp. 1043-1045.

(Continued)

*Primary Examiner*—Young T. Tse
(74) *Attorney, Agent, or Firm*—David D. Brush; Westman, Champlin & Kelly P.A.

(57) ABSTRACT

A method for receiving a signal modulated according to a multilevel coding technique, comprising at least two coding levels each having different noise robustness, said signal including a plurality of symbols each comprising at least one bit, assigned to one of said coding levels, said method comprising at least one decoding iteration including successive steps of decoding each of said received bits, at least one of said decoding steps integrated the result of at least one possible previous decoding step. The invention is characterized in that it consists in decoding said bits according to a predetermined sequence taking into account the robustness of said levels, the bit(s) assigned to the decoding level having the higher noise robustness, called most robust level, being decoded first.

32 Claims, 4 Drawing Sheets

U.S. PATENT DOCUMENTS

| | | | |
|---|---|---|---|
| 2003/0051201 A1* | 3/2003 | Brenna | 714/763 |
| 2003/0091129 A1* | 5/2003 | Zhang et al. | 375/340 |
| 2003/0103584 A1* | 6/2003 | Bjerke et al. | 375/340 |
| 2004/0017857 A1* | 1/2004 | Chouly et al. | 375/295 |

OTHER PUBLICATIONS

Papke et al., "Different Iterative Decoding Algorithms for Combined Concatenated Coding and Multiresolution Modulation," IEEE International Conf., 1994, pp. 1249-1254.

Khairy et al., "Asymmetric Modulation and Multistage Coding for Multicasting with Multi-level Reception over Fading Channels," IEEE, XP-000921925, Nov. 1999, pp. 92-96.

Kuhn, "Evaluating the Performance of Turbo-Coded Modulation in a DS-CDMA Environment," IEEE Journal on Selected Areas in Comm., vol. 17, No. 12, Dec. 1999, pp. 2138-2146.

Martin, "On Multilevel Codes and Iterative Multistage Decoding," IEEE Transactions on Comm., vol. 49, No. 11, Nov. 2001, pp. 1916-1925.

A.G. Burr, "Design of Optimum M-PSK Codes for Rayleigh Fading Channel," IEE Proc.-Commun., vol. 147, No. 1, Feb. 2000, pp. 13-17.

* cited by examiner

RECEPTION OF A SIGNAL MODULATED ACCORDING TO A MULTILEVEL CODING TECHNIQUE

CROSS-REFERENCE TO RELATED APPLICATION

This Application is a Section 371 National Stage Application of International Application No. PCT/FR2003/002878, filed Oct. 1, 2003 and published as WO 2004/032397 A1 on Apr. 15, 2004, not in English, which is based on French Application No. 02/12158, filed on Oct. 1, 2002, the contents of which is hereby incorporated by reference in its entirety.

FIELD OF INVENTION

The field of the invention is that of signal processing and digital communications.

BACKGROUND OF THE INVENTION

More specifically, the invention relates to a technique to optimize the decoding of a signal modulated according to a multi-level coding or MLC technique.

To date, there are several known coded-modulation channel-coding techniques. Indeed, following Ungerboeck's discovery of lattice-coded modulation also known as MCT ("Channel Coding with Multilevel/Phase Signals"), described in IEEE Trans. IT, January 1982, 28, No. 1, pp. 55-67), block-coded modulation or BCM and trellis-coded multidimensional modulation have been proposed.

BCM type modulation has been described especially by Cusack in "Error control codes for QAM signaling>>, Electronics Letter, January 1984, 20, pp. 62-63 and Sayegh in "A class of optimum block codes in signal space", IEEE Trans. COM, October 1986, 34, No. 10, pp. 1043-1045.

Trellis-coded multidimensional modulation has been described especially by Wei in "Trellis-coded Modulation with Multidimensional Constellations", IEEE Trans. IT, July 1987, 33, n°4, pp. 483-501 and by Calderbank and Sloane in "New trellis codes based on lattices and cosets", IEEE Trans. IT, March 1987, 33, No. 2, pp. 177-195.

Moderately complex trellis-coded modulation (typically with 4 or 8 states) may give a coding gain of 3 to 4 dB. However, in applications of high-capacity RF beams, the implementation of the Viterbi decoder, which is necessary to decode the modulation, is still very costly.

A new family of BCM codes is therefore being proposed for these particular applications. Such codes are simpler to implement, but their coding gain is generally limited to 2 dB.

An attractive coding technique for high-capacity RF beam applications has been proposed by Imai and Hirakawa in "A new multilevel coding method using error-correction codes" IEEE Trans. IT, May 1977, 23, No. 3, pp. 371-377. This is a technique of multi-level coding whose value lies in the existence of a simple step-by-step coding method, entailing an efficient compromise between performance and complexity of implementation.

Here below, a brief description is given of the principle of multi-level coding as well as the associated method of step-by-step decoding.

We consider a $2^m$-point constellation $A_0$ capable, therefore, of transmitting m bits per symbol.

If m designates the number of bits to be coded, the constellation $A_0$ is partitioned into m levels, thus giving $2^m$ subsets. The principle of this partition is identical to the one defined by Ungerboeck, and serves to maximize the minimum Euclidean distance in the subsets of the partition. If $d_i$ designates the minimum Euclidean distance in the subsets obtained at the $i^{th}$ partition level, the following inequality must be verified:

$$d_0 < d_1 < d_2 < \ldots < d_m \quad (1)$$

where $d_0$ is the minimum distance in the constellation $A_0$.

Figure 1:
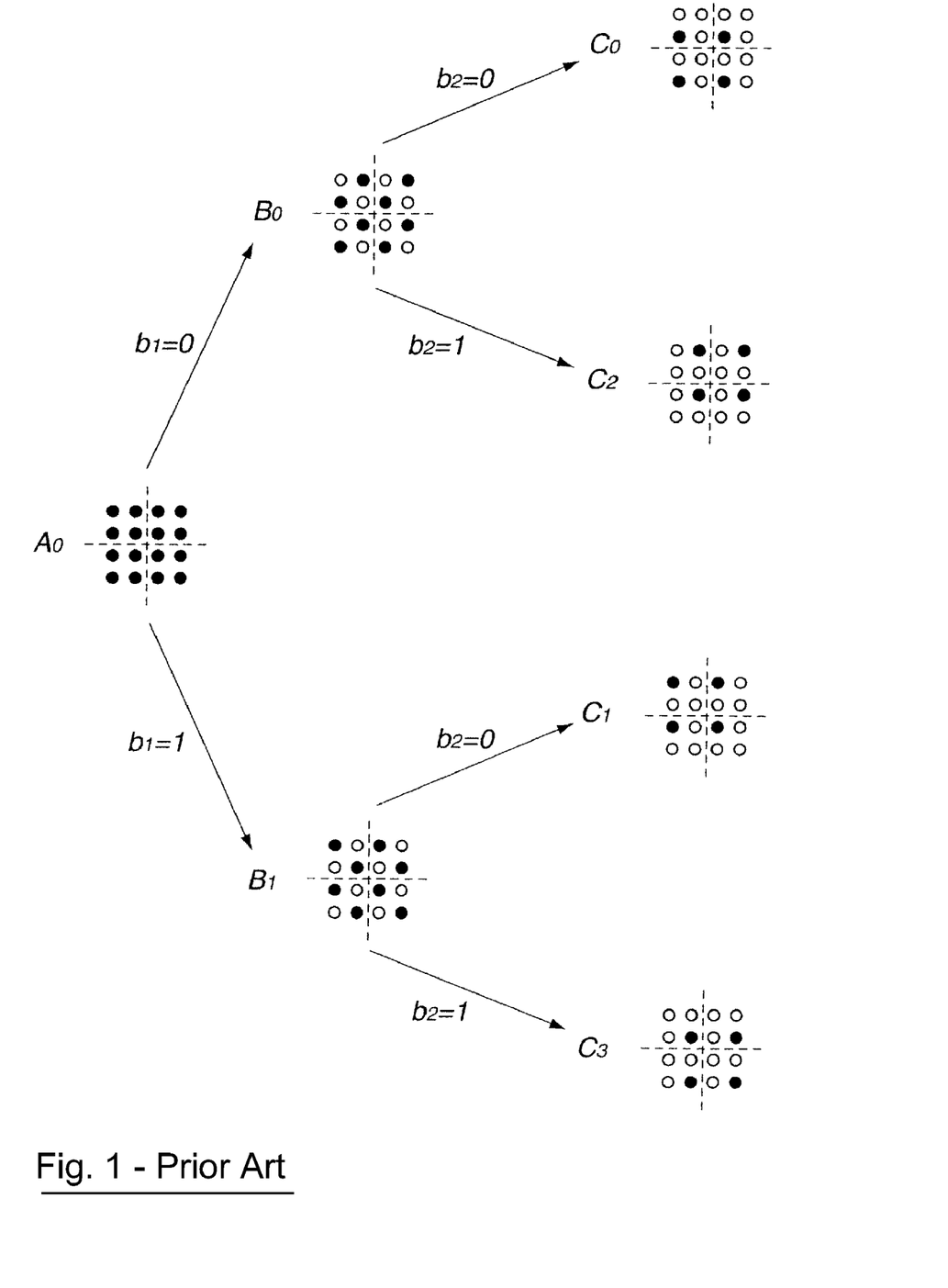
FIG. 1, already described with reference to the prior art, shows an example of a partition of a constellation $A_0$ into m levels, giving $2^m$ subsets when m=2.

Thus, the m bits $b_1, b_2, \ldots, b_m$, where $b_i$ is the bit assigned to the $i^{th}$ level of the partition, select a subset among the $2^m$ subsets. FIG. 1 gives a diagram of this partition where m=2. $A_0$ is partitioned first of all into two subsets $B_i$, $i \in \{0, 1\}$ and where $i=b_1$, with a minimum distance $d_1$, then into four subsets $C_i$, $i \in \{0, 1, 2, 3\}$ and where $i=b_1+2b_2$, with a minimum distance $d_2$. If $A_0$ is a square constellation with a Euclidean distance $d_0$, then $d_1 = \sqrt{2}d_0$ and $d_2 = \sqrt{2}d_1 = 2d_0$.

This process of assigning points of the constellation $A_0$ is aimed at classifying the m bits that represent the symbol sent as a function of their vulnerability to noise. Indeed, it can be seen that the bit $b_2$ is less vulnerable than the bit $b_1$, since there is a minimum Euclidean distance of $d_2 > d_1$ corresponding to it. According to the relationship (1), it can be shown that, if the bits $b_k$, k=i−1 are sufficiently protected so that they are accurately received, the bit $b_i$, i=m is better protected from noise than the other bits $b_j$, j<i. It was therefore envisaged to code these bits separately with different codes.

This is the principle of multi-level coding which, after partitioning the constellation $A_0$ into m levels, consists in using m coders $E_i$, i=1, . . . , m, to protect these m bits with several levels of protection.

In other words, the principle of multi-level coding relies on the joint optimization of the coding and of the modulation, enabling improved transmission performance to be achieved. Thus, in the context of a QAM ("Quadrature Amplitude Modulation"), greater protection is given to the bits which, owing to their position in the QAM mapping, are more likely to be affected by error. The protection given to the different bits depends on the coding used.

Figure 2:
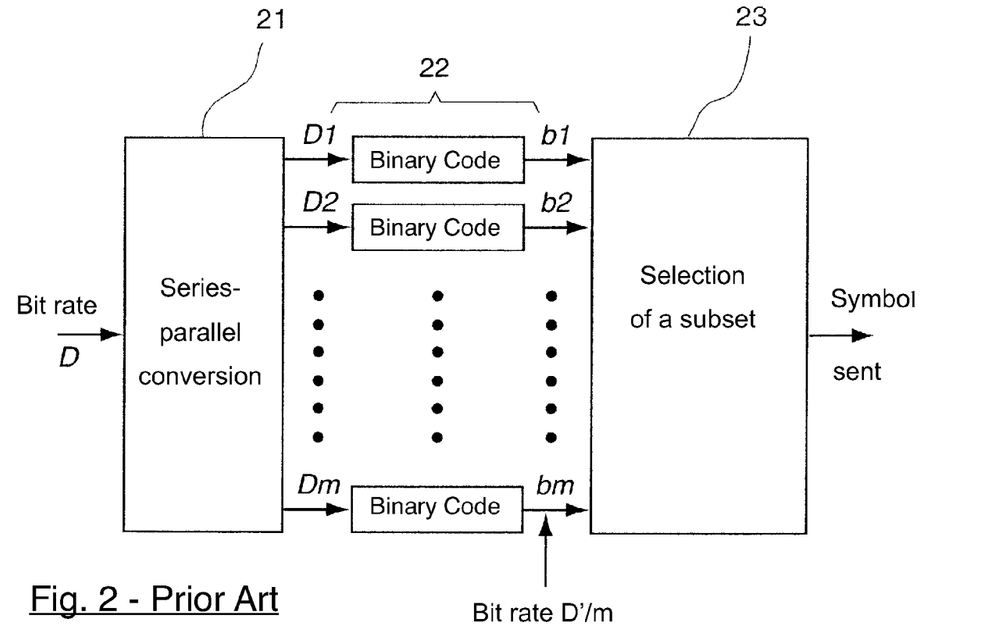
FIG. 2, already described with reference to the prior art, is a block diagram of a multi-level coder.

The pattern of this coding concept is illustrated in FIG. 2. The data stream to be transmitted, at a bit rate D, is divided by the series-parallel conversion block 21 into m streams with a bit rate $D_i$, i=1, . . . , m. The m first strings are coded by m binary codes $E_i(n_i, k_i, d_i)$, i=1, . . . , m, referenced 22, with a coding rate $R_i = k_i/n_i$ and a minimum Hamming distance $d_i$. At the input to the modulator 23, the m binary strings must be synchronous, with a bit rate D'/m. It is therefore possible to define an equivalent coding rate R given by $$R = D/D' \quad (2)$$

If it is assumed that all the $n_i$ values are equal, giving $n_i = n$, i=1, . . . , m, and that the m codes $E_i$ are block codes, this coding can be described by a matrix structure identical to the one used for the BMCs described especially by Sayegh in the article mentioned here above. A code word contains n symbols and may be represented by a matrix of m rows and n columns where the $j^{th}$ column represents the binary assignment of the $j^{th}$ symbol of the block, and the $i^{th}$ row represents the $i^{th}$ partition level. The row i, i=1, . . . , m is a code word $E_i$ $(n_i, k_i, d_i)$. The minimum Euclidean distance d obtained with this coding is given by $$d^2 = \min_{i=1, \ldots, M+1}(d_i d_{i-1}^2), \text{ with } d_{m+1} = 1. \quad (3)$$

Knowing that the $d_i$ values verify the above relationship (1), the multi-level coding is optimized if:

$$d_1 > d_2 > \ldots > d_m. \quad (4)$$

It has therefore been determined that the bit $b_1$ had to be the most protected bit, then $b_2$ etc. This matrix description can be generalized to the case where the codes would be any codes whatsoever. If the $n_i$ values are not identical, it is enough to consider a matrix with m rows and l columns where l is the least common multiple of the $n_i$ values, i=1, ..., m. In the particular case where one of the codes is the convolutive code, the matrix to be considered is semi-infinite.

The decoding method classically used in association with a multi-level coding of this kind is a sub-optimal step-by-step decoding, which has the advantage of being very simple to implement.

Figure 3:
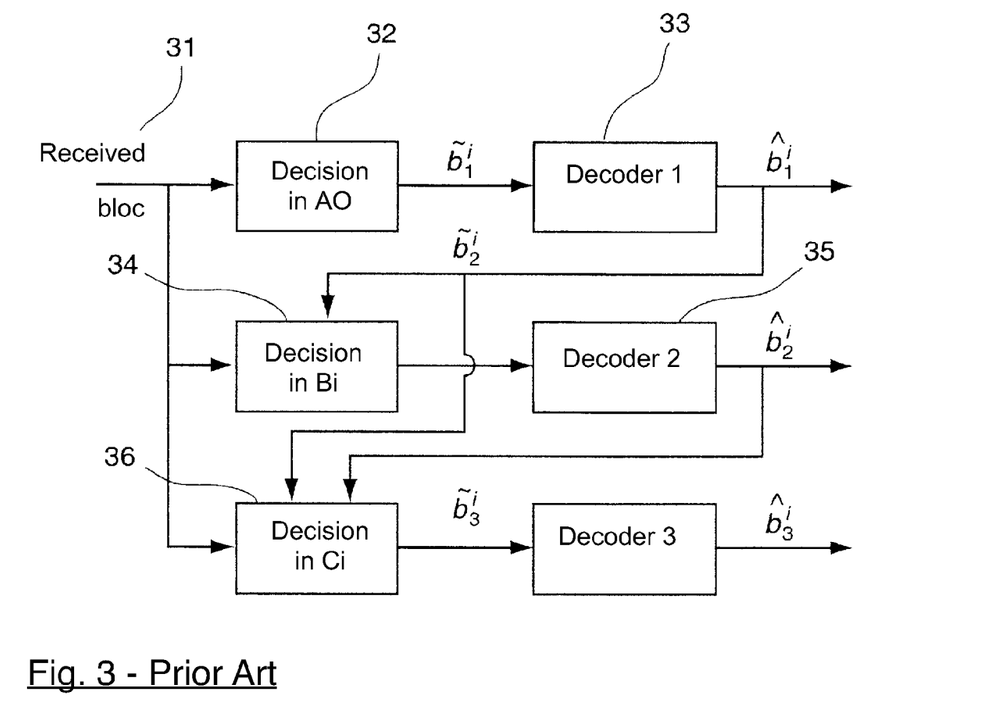
FIG. 3 already described with reference to the prior art, is a block diagram of the step-by-step decoder implemented in the prior art, in association with the multi-level coder of FIG. 2, in the case of a three-level coding.

According to this technique, the decoding method is done step-by-step where each bit is decoded independently by a simple decoder working on hard decisions but where the output of the decoder (i) may make a correction on the bits at the input of the decoder (i+1). FIG. 3 gives a block diagram of this type of decoder, where m=2. Given $(r_1, r_2, \ldots, r_n)$ the block 31 of n symbols received at the input of the decoder, the decoding operation is performed in the following successive steps:

first of all the n bits $b^i{}_1$, i=1, ..., n assigned to the first partitioning level ($A_0$) are decoded: a hard decision 32 in $A_0$ is effected every $r_i$, i=1, ..., n. Thus a first estimation of $b^i{}_1$, i=1, ..., n, is obtained written $\tilde{b}_1{}^i$, i=1, ..., n. A hard-decision decoding 33 working on $\tilde{b}_1{}^i$, i=1, ..., n gives a final estimation written $\hat{b}_1{}^i$, i=1, ..., n.

then the n bits $b^i{}_2$, i=1, ..., n. assigned to the second partition level ($B_0$ or $B_1$) are decoded: as a function of the bits $\hat{b}_1{}^i$, i=1, ..., n which are encoded by the same encoder used at transmission, a second decision operation 34 is effected on the symbols $r_i$, i=1, ..., n in the subsets $B_{pi}$ with $p_i = \hat{b}_1{}^i$ for i=1, ..., n. The bits $\tilde{b}_2{}^i$, i=1, ..., n obtained are decoded by the decoder "2" referenced 35 to give a final decision $\hat{b}_2{}^i$, i=1, ..., n.

finally, the remaining non-coded bits are decoded: from the bits $\hat{b}_1{}^i, \hat{b}_2{}^i$, i=1, ..., n, recoded by their associated coder, a third detection 36 is made of $r_i$, i=1, ..., n, in the subsets of the second partition level $C_i$, i=1, ..., n. Thus, an estimation of the m−2 remaining non-coded bits is obtained for each of the symbols $r_i$, i=1, ..., n.

According to the decoding technique associated with multi-level coding or MLC, the first decoding is therefore done systematically in the subset $A_0$ of the constellation. The result of this decoding is then exploited for the decoding of the next subset $B_0$. A decoding technique of this kind is described especially in the article by L. Papke and K. Fazel, "Different Iterative Decoding Algorithms for Combined Concatenated Coding and Multiresolution Modulation" on the terrestrial broadcasting of television signals, coded according to a multi-level coding technique. More specifically, this document by Papke describes a solution based on multi-level coding and decoding to obtain three streams related to three different services, the SDTV stream being more robust than the EDTV stream, which is itself more robust than the HDTV stream. This Papke technique is aimed at protecting the most important streams, in accentuating the robustness of the level with which they are associated. In practice, according to the Papke decoding technique, an estimation is made first of all of the $u_i{}^1$ bits assigned to the $2^m$-point constellation, then the $u_i{}^2$ bits assigned to the subsets of the constellation corresponding to $u_i{}^1$, etc.

Now, for an MLC to be optimal, the decoding gain that must be obtained between the different coding levels is 6 dB, which is very difficult to obtain.

One drawback of this prior art technique therefore is that the decoding method conventionally implemented in the context of MLC coding shows mediocre performance.

In particular, such a technique of sub-optimal step-by-step decoding is poorly adapted to channels presenting additive Gaussian noise and Doppler-affected multiple-path channels.

It is a goal of the invention especially to overcome these drawbacks of the prior art.

SUMMARY OF THE INVENTION

More specifically, it is a goal of the invention to provide a technique for the decoding of a signal modulated according to an MLC coding technique, having improved performance compared with the prior art techniques.

It is another goal of the invention to implement such a technique, that enables a reduction in the binary error rate (or BER) as compared with the sub-optimal decoding technique of the prior art.

It is also a goal of the invention to provide a technique of this kind that is simple and costs little to implement, and is suited to disturbance-prone channels, and especially to channels showing Gaussian additive noise and Doppler-affected multiple-path channels.

These goals, as well as others that shall appear here below, are achieved by means of a method for the reception of a signal modulated according to a multi-level coding technique, comprising at least two coding levels each having a distinct noise robustness. Such a signal has a plurality of symbols each comprising at least one bit, assigned to one of said coding levels, and such a reception method comprises at least one iteration of decoding comprising successive steps for the decoding of each of the bits received, at least one of said decoding steps taking account of the result of said at least one possible preceding step of decoding.

According to the invention, said bits are decoded in a predetermined order taking account of the robustness of said levels, the bit or the bits assigned to the coding level that have the greatest noise robustness, called the most robust level, being decoded first.

Thus, the invention is based on a wholly novel and inventive approach to the decoding of a signal modulated according to a technique of multi-level coding. Indeed, unlike in the sub-optimal decoding method used in the prior art, the invention proposes to perform a decoding of the different partition levels that takes account of the vulnerability of these levels to noise. Thus, the most robust level is decoded first, in order to be able to then propagate the result of the decoding from this level to the less robust levels. Thus, the decoding performance obtained is highly improved as compared with the sub-optimal decoding techniques of the prior art.

Advantageously, said predetermined order corresponds to the decreasing order of the robustness of the coding levels to which said received bits are assigned.

Preferably, each of said successive decoding steps takes account of the result of said preceding decoding step or steps so as to improve the result of said steps for the decoding of said bits assigned to the less robust levels.

Thus, the result of the decoding of the bits of a given level of robustness is systematically exploited during the decoding of the bits of the directly lower robustness level, thus greatly improving the confidence that may be given placed to this second decoding.

According to one advantageous embodiment of the invention, said bits assigned to said most robust level are the most significant bits of said corresponding symbol.

This alternative embodiment corresponds especially to the particular mode of implementation chosen by the standardization consortium DRM (Digital Radio Mondiale as presented in the document ETSI ES 201 980 V1.2.1 (2002-07)).

Preferably, within one of said decoding iterations, each of said successive steps for the decoding of said received bits is preceded by a corresponding demodulation step.

The received bits are therefore first demodulated and then decoded.

Advantageously, a reception method of this kind comprises at least two successive decoding iterations, one step for decoding the bits of a given level taking account, during the $n^{th}$ iteration where $n \geq 2$, of the result of at least certain of said steps of decoding of said received bits assigned to the coding levels less robust than said given level, and implemented during at least one of said preceding iterations.

Thus, in a particular case comprising three coding levels, the decoding of the bits of the most robust level takes account especially, during the second iteration, of the result of the decoding of the bits of the two least robust levels obtained during the first iteration.

Preferably, a reception method of this kind has two successive decoding iterations.

Indeed, the inventors have noted that the increase in performance resulting from the implementation of a third iteration was low or, at the very least, negligible in relation to the corresponding increase in complexity.

Advantageously, at the end of at least certain of said iterations, a reception method of this kind implements a step for the estimation of a sent symbol, and a step for the computation of an extrinsic piece of information taking account of said estimated sent symbol, said extrinsic piece of information enabling an improvement in the result of said steps for the decoding of said following iteration or iterations.

Thus, after the first decoding iteration, a piece of extrinsic information will be computed and will be used during the second decoding iteration, in order to heighten its performance.

Advantageously, said piece of extrinsic information has the form: $\alpha(S_r-S_e)$, where $\alpha \in [0, 1]$, $S_r$ is said received symbol and $S_e$ is said estimated sent symbol.

In the particular case where two successive iterations are implemented, the extrinsic information is therefore proportional to the difference between the received symbol and the symbol estimated from the decoded bits of the different levels during the first iteration. This difference is weighted by a characteristic coefficient of the confidence given to the decoding.

In a first advantageous embodiment of the invention, $\alpha$ is substantially equal to 0.25.

Such a value of a makes it possible to obtain satisfactory performance during the second decoding iteration for most of the transmission channels considered.

In a second advantageous embodiment, a reception method of this kind comprises a step to optimize the value of $\alpha$ as a function of the signal-to-noise ratio.

By means of the coefficient $\alpha$, it is indeed possible to choose to place a higher or lower degree of confidence, in the extrinsic piece of information, in the estimated sent symbol, in order to take account of it to a greater or lesser degree during the following coding iterations. The optimization of the value of a as a function of the signal-to-noise ratio leads to values of $\alpha$ close to 1 when the signal-to-noise ratio is very high, and to values close to 0 when the contrary is the case.

According to an advantageous characteristic of the invention, such a reception method furthermore comprises a step for determining a signal-to-noise ratio from at least one piece of reference information sent, called pilot information, the value of which is known a priori in reception.

It may be recalled, indeed, that a classic technique to estimate the transmission channel in OFDM, for example, consists of the insertion of reference carriers, at positions known to the receiver, into the stream of payload carriers. At reception, the values taken by these reference carriers, called pilot carriers, are read and the complex gain of the channel at these reference positions is easily deduced therefrom. The complex gain of the channel is then derived on all the points of the time-frequency network transmitted, from the computed value of the complex gain at the reference positions.

A pilot-based mechanism of this kind can therefore be used, in the framework of the invention, to determine the signal-to-noise ratio and therefore optimize $\alpha$. It is used especially in the DVB-T standard ("Digital Video Broadcasting (DVB); Framing Structure, Channel Coding and Modulation for Terrestrial Television (DVB-T) standard, ETS 300 744, March 1997).

According to an advantageous embodiment of the invention, such a reception method furthermore comprises, for at least certain of said coding levels, an additional de-interleaving step implemented between the said steps for the modulation and decoding of said received bits.

An embodiment of this kind can be used especially to improve the performance of the reception method relative to the Doppler-affected transmission channels.

The invention also relates to a method for the decoding of a signal modulated according to a multi-level coding technique, comprising at least two coding levels each having a distinct noise robustness, said signal comprising a plurality of symbols each comprising at least one bit, assigned to one of said coding levels, said method comprising at least one iteration of decoding comprising successive steps of decoding of each of said bits received, at least one of said decoding steps taking account of the result of said at least one preceding step of decoding if any.

According to the invention, said bits are decoded in a predetermined order taking account of the robustness of said levels, the bit or the bits assigned to the coding level that have the greatest noise robustness, called the most robust level, being decoded first.

The invention also relates to a device for the reception of a signal modulated according to a multi-level coding technique, comprising at least two coding levels each having a distinct noise robustness, said signal comprising a plurality of symbols each comprising at least one bit, assigned to one of said coding levels, said device comprising decoding means implementing a successive decoding of each of said bits received, the decoding of at least one of said bits received taking account of the result of said at least one preceding decoding operation if any.

According to the invention, said decoding means decode said bits in a predetermined order taking account of the robustness of said levels, the bit or the bits assigned to the coding level that have the greatest noise robustness, called the most robust level, being decoded first.

The invention also relates to a system for the coding/decoding of a signal comprising a plurality of symbols each comprising at least one bit, assigned to one of said coding levels.

Such a system comprises at least one coding device enabling the modulation of said signal according to a multi-level coding technique, comprising at least two coding levels each having a distinct noise robustness, and at least one decoding device comprising decoding means implementing a successive decoding of each of said received bits, the decoding of at least one of said received bits taking account of the result of at least one previous decoding if any, said decoding means decoding said bits in a predetermined order taking account of the robustness of said levels, the bit or bits assigned to the coding level that show the greatest noise robustness, called the most robust level, being decoded first.

The invention finally relates to the applications of the reception method described here above to at least one of the following fields:
- digital radio transmission, especially of the DRM ("Digital Radio Mondiale") type;
- error corrector codes;
- digital signal processing;
- digital communications;
- the recording/playback of a digital signal.

Other features and advantages of the invention shall appear more clearly from the following description of a preferred embodiment, given by way of a simple, non-exhaustive illustrative example and from the appended drawings.

DETAILED DESCRIPTION OF THE PREFERRED EMBODIMENTS

The general principle of the invention relies on taking account of the noise robustness of the different coding levels of a signal modulated according to a multi-level coding MLC technique, to determine the order of decoding of the received bits.

Figure 4:
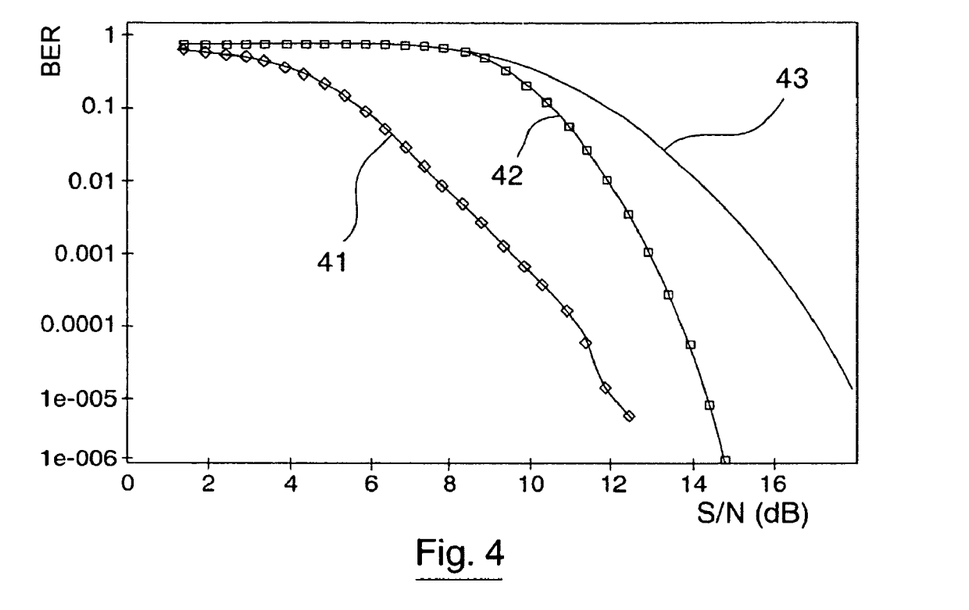
FIG. 4 presents a comparison of the robustness of different levels of MLC coding as a function of a Gaussian additive white noise.

Referring to FIG. 4, we present the concept of robustness of an encoding level, in the context of a multi-level coding or MLC technique.

The robustness of a coding level may be illustrated by the curve of the binary error rate of this level, and the function of the signal-to-noise (S/N) ratio: throughout the document, a coding level shall be considered to be all the more robust as the binary error rate associated with it is low.

By decoding each coding level independently, i.e. without making any return loop from one level to another (in other words, the result of the decoding of one level is not used in the decoding of the next level)), it is possible to determine the level of noise robustness of each level. More particularly, FIG. 4 illustrates the robustness of each MLC coding level relative to a Gaussian additive white noise.

Thus, the DRM (Digital Radio Mondiale) standardization as presented in the document ETSI ES 201 980 V 1.2.1 (2002-07) has chosen multi-level coding MLC for the broadcasting of a digital signal in the AM (Amplitude Modulated) bands whose frequencies are below 30 MHz. One of the modes chosen by DRM comprises a 64QAM (Quadrature Amplitude Modulation) with an overall coding efficiency of R=0.6 with $R_{MSB}$=0.8 $R_{ISB}$=0.67 and $R_{LSB}$=0.33, where MSB represents the set of the most significant bits, LSB represents the set of the least significant bits and ISB represents the set of the intermediate significant bits.

Thus, a point of the 64QAM corresponds to a set of bits, namely one bit assigned to the MSB level, one bit to the ISB level, and one bit to the LSB level.

In decoding the three QAM modulation levels, namely MSB, ISB and LSB, it is observed that the most robust level is the one corresponding to the MSBs (curve referenced 41), then to the LSBs (curve referenced 42) and finally to the intermediate level bits or ISBs (curve referenced 43), as illustrated in FIG. 4. Indeed, the BER curve 41 associated with the MSB level is the one that falls most rapidly as a function of the signal-to-noise (S/N) ratio, and the BER curve 43 associated with the ISB level is the one that decreases most slowly as a function of the signal-to-noise (S/N) ratio.

However, it is possible to again analyze the performance of the ISB and LSB levels by looping back from the most robust level (MSB), i.e. in taking the result of the decoding of the MSB level into account in the decoding of the ISB and LSB levels.

It can be seen then that the ISB level becomes the second most robust level, before the LSB level: thus, the decreasing order of robustness of the coding levels is MSB-ISB-LSB.

According to the technique proposed by the invention, the optimum order of the decoding of the MLCs is therefore the decreasing order MSB-ISB-LSB.

Figure 5:
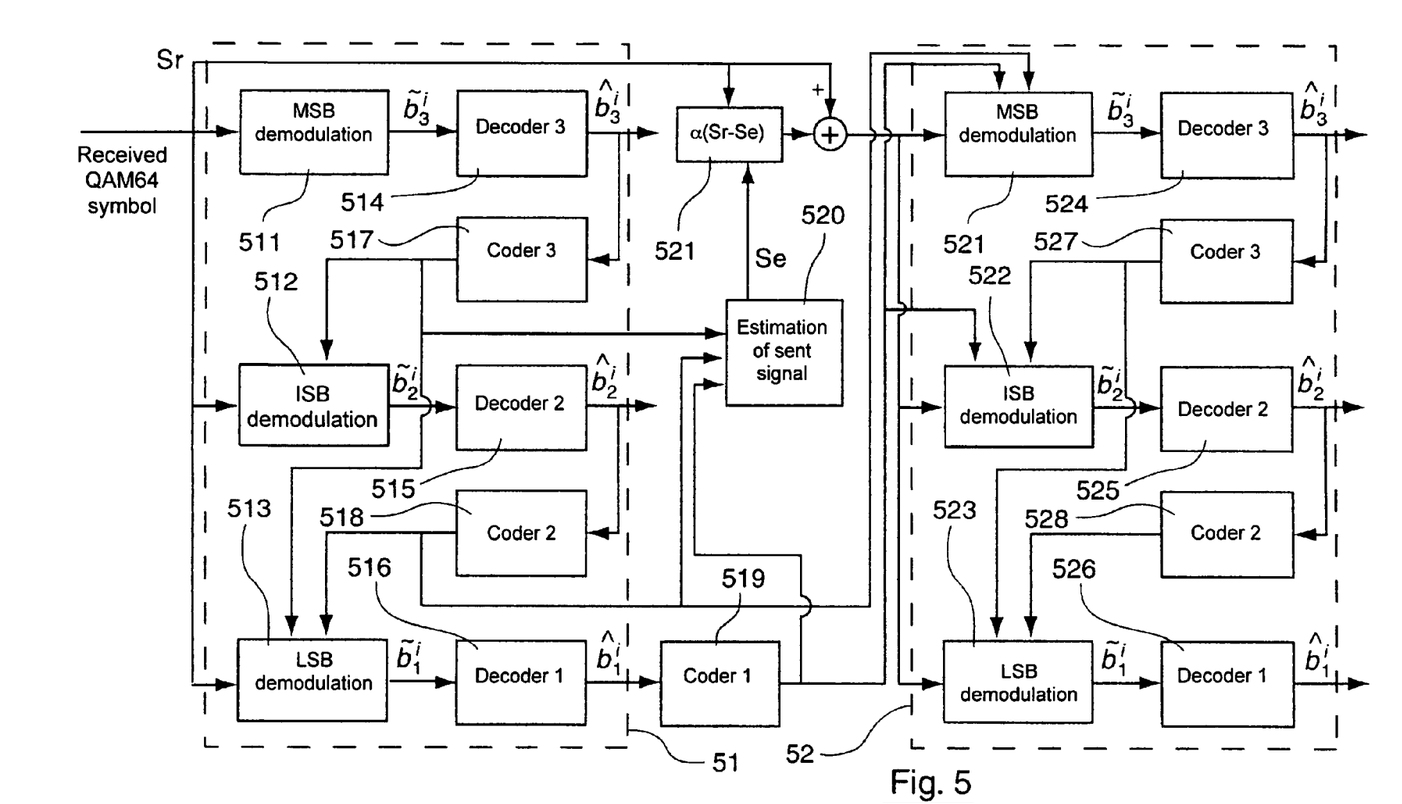
FIG. 5 is an example of a receiver according to the invention, carrying out the optimized decoding of a QAM64 symbol with two iterations and the use of the extrinsic information.

Referring now to FIG. 5, we present an exemplary embodiment of a receiver according to the invention.

The working of such a receiver is based on four main principles:
- the first principle is based on the modulation, and then the decoding, first of all of the most robust level, the result of such a decoding enabling an improvement in the demodulation, and hence the decoding, of the less robust levels. This operation is repeated until the least robust encoding level;
- the second principle implemented by a receiver according to the invention is that of an iterative process. Indeed, after demodulation and decoding of all the levels, the operation may be repeated so as to improve the demodulation of the most robust level by means of the result of the decoding of the lower levels;
- the third principle of operation relies on the implementation of a test of the relevance of the correction of the modulated signal as a function of the amplitude of the corrective signal relative to the signal to be demodulated;
- finally, such a receiver uses a piece of extrinsic information, between each iteration, in order to improve the demodulation and hence the decoding of the received signal.

These four principles are presented in greater detail with reference to FIG. 5, which presents a particular embodiment, in the context of a QAM64 (Quadrature Amplitude Modulation) modulation. It will of course be easy for those skilled in the art to extend this description to any type of multi-level modulation.

In the particular embodiment of FIG. 5, the most robust level corresponds to the level of coding of the most significant bits (MSB) and the least robust level corresponds to the least significant bits (LSB). As explained here above with reference to FIG. 4, the noise robustness of a coding level is inversely proportional to the error rate of this level. Furthermore, the error rate is a function of the efficiency of the coding, the power associated with each bit (also called the level of the bit) and the signal-to-noise ratio (indeed, the errors observed in the signal depend of course on the noise that affects it).

It will therefore easily be understood that the most robust level is not necessarily the level of the most significant bits. By way of an illustration, however, the following description shall focus especially on the presentation of an embodiment of the invention in this particular case.

The receiver of FIG. 5 has two stages referenced 51 and 52, corresponding to two successive decoding iterations. Indeed, the inventors have observed that the improvement in decoding performance resulting from the implementation of the third decoding iteration is low and thus, in the preferred embodiment of the invention, only two iterations of the decoding process are implemented. Thus an efficient compromise is obtained between performance and complexity.

We describe first of all the first decoding stage referenced 51. This stage is supplied with the received QAM64 symbol, also called $S_r$, which is distributed to the three demodulators referenced 511 to 513, respectively providing for the MSB, ISB and LSB demodulations. The received symbol $S_r$ is formed by three bits $X_{RMSB}$, $X_{RISB}$, $X_{RLSB}$ respectively assigned to the MSB, ISB and LSB levels, which may be expressed in the form: $S_r = X_{RMSB} + X_{RISB} + X_{RLSB}$.

The first step implemented at the reception of the symbol $S_r$ consists in demodulating the bits assigned to the most noise-robust level, i.e. in this case the most significant bits (MSB). Thus, at output of the demodulator 511, the demodulated bits $\tilde{b}_3^i$, i=1, ..., n, which supply the decoder referenced 514 are obtained. After decoding by the decoder 514, the decoded bits $\hat{b}_3^i$, i=1, ..., n are obtained.

The second step consists in coding the decoded bits $\hat{b}_3^i$, i=1, ..., n with the coder used at transmission, called the "coder 3", referenced 517. The bits thus coded are fed to the ISB demodulator referenced 512, which takes account of them to demodulate the intermediate significant bits (ISB) $\tilde{b}_2^i$, i=1, ..., n. The demodulated intermediate significant bits are given at input of the decoder referenced 515 which, after decoding, delivers the decoded intermediate significant bits $\hat{b}_2^i$, i=1, ..., n. It will be noted that the ISB coding level here is the intermediate noise robustness level and that it is therefore demodulated and decoded directly after the MSB level.

The decoded intermediate significant bits $\hat{b}_2^i$, i=1, ..., n, are furthermore given at input of the coder referenced 518, which is identical to the coder used at transmission for the ISB level.

By using the recorded bits of the upper levels of robustness (MSB and ISB), it is then possible to demodulate the bits of the less robust level which, in the preferred embodiment described with reference to FIG. 5, corresponds to the level of the least significant bits (LSB).

To do this, the LSB demodulation device referenced 513 is supplied with the re-coded bits coming from the coders referenced 517 and 518 of the more robust MSB and ISB levels, and delivers the demodulated least significant bits, $\tilde{b}_1^i$, i=1, ..., n. After decoding by the decoder referenced 516, the decoded least significant bits $\hat{b}_1^i$, i=1, ..., n, are obtained.

The decoded least significant bits $\hat{b}_1^i$ may furthermore feed the coder referenced 519, which is identical to the coder used at transmission for the LSB level.

After decoding of the three levels of the QAM level, it is possible to determine (520) an estimation of the symbol sent, from the recoded bits delivered by the three coders referenced 517 to 519.

Thus, in the particular embodiment described in relation to FIG. 5, the symbol $S_e$ sent has the form $S_e = 4b_{MSB} + 2b_{ISB} + b_{LSB}$, where $b_{MSB}$, $b_{ISB}$ and $b_{LSB}$ respectively correspond to the bits of the MSB, ISB and LSB levels.

From the estimated symbol sent, the Euclidean distance between the sent symbol $S_e$ and the received symbol $S_r$, is computed in weighting this distance by a coefficient $\alpha$ ($0 < \alpha < 1$). Thus an extrinsic piece of information $a(S_r - S_e)$ 521 is determined. This extrinsic piece of information can be used in the second state 52 of the receiver to improve the decoding of the following iterations.

The second decoding stage 52 works similarly to the first stage referenced 51. It has especially three demodulation devices referenced 521 to 523, and three decoders referenced 524 to 526 respectively associated with the three coding levels MSB, ISB and LSB.

The first step implemented within this stage 52 is the demodulation of the most robust MSB level by the block referenced 521. Such a block 521 is supplied, firstly, by the recorded bits of the less robust levels, ISB and LSB, coming from the coders referenced 518 and 519 of the first decoding stage 51 and, secondly, by the received signal $S_r$, from which the extrinsic piece of information $a(S_r - S_e)$, namely $S_r (1-\alpha) + \alpha S_e$ has been extracted.

The coefficient $\alpha$ is preferably chosen to be close to 0.25. In one alternative embodiment, the value of the coefficient $\alpha$ is optimized as a function of the signal-to-noise ratio. In this way, depending on the signal-to-noise ratio, it may be chosen to place greater or lower confidence in the estimation 520 of the symbol sent, to take account of it in varying degrees during the second decoding iteration, and especially during the decoding of the most robust MSB level.

Thus, if the signal-to-noise ratio is very good, a will be chosen to be close to 1. If not, a will be chosen to be close to 0.

Such an optimization of $\alpha$ can be preceded especially by a step for determining the signal-to-noise ratio, by means of pilot values, inserted into the signal sent. According to a prior art technique, the pilots constitute reference information whose value is known a priori to the receiver. By comparing this predetermined value of the pilots with the value of the received pilots, the receiver may estimate the transfer function of the transmission channel, and hence the signal-to-noise ratio affecting the sent signal, by division. This technique furthermore makes it possible to assess the robustness of the different coding levels.

After demodulation by the block referenced 521, new demodulated bits $\tilde{b}_3^i$, i=1, ..., n, are obtained. These new demodulated bits are improved relative to the corresponding bits coming from the demodulation block referenced 511, owing to the fact that the extrinsic information and the result of the decoding of the less robust LSB and ISB levels of the first decoding stage 51 are jointly taken into account.

These demodulated bits $\tilde{b}_3^i$, i=1, ..., n, are fed into the decoder referenced 524, which delivers the improved decoded bits $\hat{b}_3^i$, i=1, ..., n. As above, these bits are re-coded by the coder, identical to the one used at transmission, referenced 527, and then fed into the demodulation device of the ISB level referenced 522. This demodulation device 522 is furthermore fed at input by the difference between the received symbol and the extrinsic information, in the form $S_r (1-\alpha) + \alpha S_e$, and by the re-coded bits of the less robust LSB level, coming from the coder referenced 519.

The ISB demodulator 522 delivers the demodulated intermediate significant bits $\tilde{b}_2^i$, i=1, ..., n, which feed the decoder referenced 525 delivering $\hat{b}_2^i$ improved decoded bits $\hat{b}_2^i$, i=1, ..., n.

Again, these bits $\hat{b}_2^i$ i=1, ..., n are re-coded by means of the coder, identical to the one used at transmission, referenced 528, and are then given at the input of the least robust LSB level referenced 523. This demodulation block referenced 523 is furthermore fed with the difference between the received symbol and the extrinsic information, in the form $S_r \cdot (1-\alpha)+\alpha S_e$. It therefore delivers demodulated bits $\tilde{b}_1^i$, i= 1, ..., n, improved with respect to the corresponding bits coming from the first decoding stage referenced 513, which feed the decoder referenced 526, this decoder delivering the improved decoded bits $\hat{b}_1^i$, i=1, ..., n.

The implementation of these two successive decoding iterations, conjugated with the use of a piece of extrinsic information, gives improved performance as compared with prior art techniques, and especially as compared with the sub-optimal step-by-step decoding method conditionally implemented for the decoding of signals modulated according to a multi-level coding technique.

Figure 6:
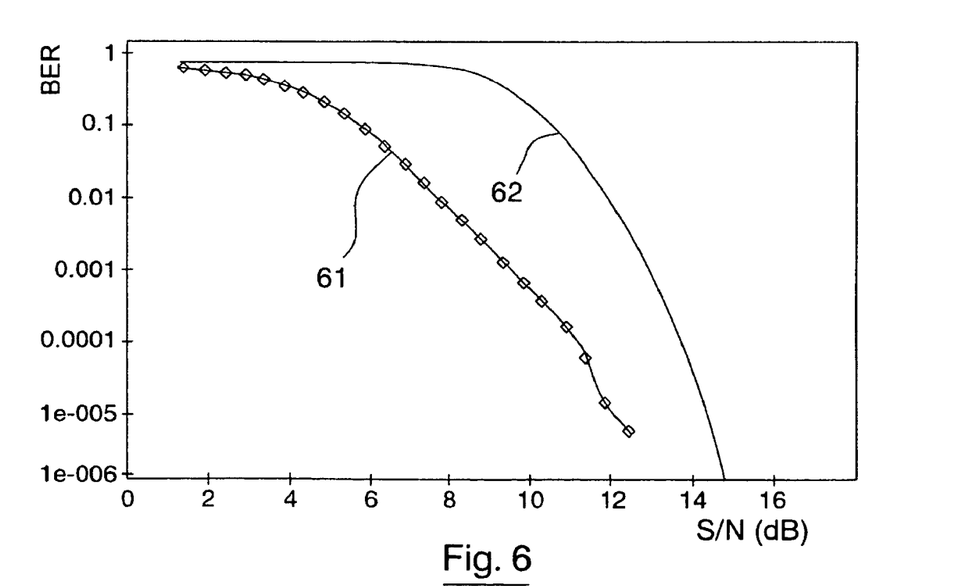
FIG. 6 illustrates the comparative decoding performance of the MLC techniques according to the sub-optimal decoding method of the prior art and the decoding method of the invention.

This performance is illustrated by the curves of FIG. 6, respectively presenting the binary error rate obtained, as a function of the signal-to-noise S/N ratio, firstly for the decoding method of the invention and, secondly, for the sub-optimal decoding method of the prior art.

Thus, it is seen that the curve referenced 61 for the binary error rate obtained by the invention decreases far more rapidly, as a function of the S/N ratio, than the binary error rate (BER) curve referenced 62 obtained by the prior art step-by-step decoding method.

In the context of the DRM consortium presented here above, it was established that the binary error rate BER of $10^{-4}$ constituted the operating threshold of the system. It will be noted, referring to FIG. 6, that a gain of about 2 dB is obtained, for this threshold of $10^{-4}$, between the decoding technique of the prior art and the decoding method of the invention.

The performance of the system of the invention could be further improved relative to the Doppler-affected transmission channel, especially by adding an interleaver, on each encoding level, at transmission. The receiver of FIG. 5 would then include a de-interleaving means, which would be implemented, for each level, after the demodulation and before the decoding.

It will be noted that any type of code can be used in the invention, and especially turbo-codes. In particular, it is possible to envisage the implementation of a turbo-code for each of the coding levels.

What is claimed is:

1. A method of decoding a signal modulated according to a multi-level coding technique, comprising at least two coding levels each having a distinct robustness to noise,
    said signal comprising a plurality of symbols ($S_r$) each comprising at least one bit, assigned to one of said coding levels,
    said method comprising:
    performing at least two successive decoding iterations with a decoder, each iteration comprising successive steps of decoding each of said at least one bit, at least one of the successive steps of decoding taking into account the result of at least one possible preceding step of decoding;
    determining the robustness to noise of said coding levels, the robustness to noise of a coding level being inversely proportional to the error rate of said coding level; and
    determining a decoding order according to the robustness to noise of said coding levels, wherein, during said decoding iterations, said bits ($\hat{b}_3^i$, $\hat{b}_2^i$, $\hat{b}_1^i$) are decoded according to said decoding order, said at least one bit assigned to one of said coding levels having a greatest robustness to noise, referred to as a most robust coding level, being decoded first.

2. The method of decoding according to claim 1, wherein said decoding order corresponds to the decreasing order of the robustness to noise of the coding levels to which said at least one bit is assigned.

3. The method of decoding according to claim 1, wherein each of said successive steps of decoding takes into account the result of said preceding step or steps of decoding so as to improve the result of said successive steps for the decoding of said bits assigned to the less robust coding levels.

4. The method of decoding according to claim 1, wherein said bits assigned to said most robust coding level are most significant bits of a corresponding symbol.

5. The method of decoding according to claim 1, wherein within one of said iterations of decoding, each of said successive steps of decoding of said at least one bit is preceded by a corresponding demodulation step.

6. The method of decoding according to claim 1, wherein a step of decoding the bits of a given level takes into account, during the $n^{th}$ decoding iteration, where $n \geq 2$, the result of at least certain of said successive steps of decoding of said at least one bit assigned to the coding levels less robust than said given level, and implemented during at least one of said preceding iterations.

7. The method of decoding according to claim 6, wherein at the end of at least certain of said decoding iterations, the method implements a step of estimating a sent symbol $S_e$, and a step of calculating an extrinsic information taking into account said estimated sent symbol.

8. The method of decoding according to claim 7, wherein said extrinsic information has the form $\alpha(S_r - S_e)$, where $\alpha \in [0, 1]$, $S_r$ is a received symbol and $S_e$ is said estimated sent symbol.

9. The method of decoding according to claim 8, wherein $\alpha$ is substantially equal to 0.25.

10. The method of decoding according to claim 8, the method further comprising a step of optimizing the value of $\alpha$ according to a signal-to-noise ratio.

11. The method of decoding according to claim 10, the method further comprising a step of estimating the signal-to-noise ratio from at least one sent reference information item, referred to as a pilot, whereof the value is known a priori in reception.

12. The method of decoding according to claim 6, wherein within one of said iterations of decoding, each of said successive steps of decoding of said at least one bit is preceded by a corresponding decoding step, the method further comprising, for at least certain of said coding levels, an additional step of de-interleaving implemented between said steps of demodulating and decoding of said at least one bit.

13. The method of decoding according to claim 1, wherein said performing step implements two successive decoding iterations.

14. The method of decoding according to claim 1, the method further comprising a step of receiving, by a receiver, prior to performing the decoding iterations, the signal modulated according to the multi-level coding technique, comprising at least two coding levels, each having the distinct robustness to noise.

15. The method of decoding according to claim 1, wherein said robustness to noise of the coding levels is determined by decoding each decoding level independently.

16. The method of decoding according to claim 1, wherein said robustness to noise of the coding levels is determined by decoding each decoding level independently in order to determine the most robust coding level, then decoding the other coding levels taking into account the most robust coding level.

17. A device for receiving a signal modulated according to a multi-level coding technique, comprising at least two coding levels each having a distinct robustness to noise,
said signal comprising a plurality of symbols each comprising at least one bit, assigned to one of said coding levels,
said device comprising decoding means for implementing at least two successive decoding iterations each comprising successive steps of decoding each of said bits ($\tilde{b}_3^i$, $\tilde{b}_2^i$, $\tilde{b}_1^i$), at least one of said successive steps of decoding taking into account the result of at least one possible preceding step of decoding;
means for determining the robustness to noise of said coding levels, the robustness to noise of a coding level being inversely proportional to the error rate of said coding level; and
means for determining a decoding order according to the robustness to noise of said coding levels,
wherein, during said decoding iterations, said decoding means decode said bits according to said decoding order taking into account the robustness to noise of said coding levels, the bit or bits assigned to the coding level having a greatest robustness to noise, referred to as a most robust coding level, being decoded first.

18. The device according to claim 17, wherein said means for determining the robustness to noise of said coding levels decode each decoding level independently.

19. The device according to claim 17, wherein said means for determining the robustness to noise of said coding levels decode each decoding level independently in order to determine the most robust coding level, then decode the other coding levels taking into account the most robust coding level.

20. The device according to claim 17, wherein said decoding order corresponds to the decreasing order of the robustness to noise of the coding levels to which said at least one bit is assigned.

21. The device according to claim 17, wherein said decoding means for implementing the at least two successive decoding iterations takes into account the result of a preceding step or steps of decoding so as to improve the result of said steps for the decoding of said bits assigned to the less robust coding levels.

22. The device according to claim 17, wherein said bits assigned to said most robust coding level are most significant bits of a corresponding symbol.

23. The device according to claim 17, said device further comprising means for demodulating and de-interleaving, activated before each of said successive steps of decoding within one of said iterations of decoding.

24. The device according to claim 17, wherein said decoding means decode the bits of a given level taking into account, during the $n^{th}$ decoding iteration, where n≧2, the result of at least certain of said successive steps of decoding of said at least one bit assigned to the coding levels less robust than said given level, and implemented during at least one of said preceding iterations.

25. The device according to claim 24, wherein at the end of at least certain of said iterations, said decoding means estimates a sent symbol $S_e$, and calculates an extrinsic information taking into account said estimated send symbol.

26. The device according to claim 25, wherein said extrinsic information has the form $\alpha(S_r - S_e)$, where $\alpha \in [0, 1]$, $S_r$ is a received symbol and $S_e$ is said estimated sent symbol.

27. The device according to claim 26, wherein α is substantially equal to 0.25.

28. The device according to claim 26, the device further comprising means for optimizing the value of α according to a signal-to-noise ratio.

29. The device according to claim 28, the device further comprising means for estimating the signal-to-noise ratio from at least one sent reference information item, referred to as a pilot, whereof the value is known a priori in reception.

30. The device according to claim 17, wherein said decoding means implements two successive decoding iterations.

31. A system for coding/decoding of a signal comprising a plurality of symbols each comprising at least one bit,
wherein the system comprises: at least one coding device enabling the modulation of said signal according to a multi-level coding technique, comprising at least two coding levels each having a distinct robustness to noise, each of said bits being assigned to one of said coding levels; and
at least one decoding device comprising:
decoding means for implementing at least two successive decoding iterations each comprising successive steps of decoding each of said at least one bit, at least one of said successive steps of decoding taking into account the result of at least one, possible preceding step of decoding;
means for determining the robustness to noise of said coding levels, the robustness to noise of a coding level being inversely proportional to the error rate of said coding level; and
means for determining a decoding order according to the robustness to noise of said coding levels,
wherein, during said decodes iterations, said decoding means decoding said bits according to said decoding order taking into account the robustness to noise of said coding levels, the bit or bits assigned to the coding level having a greatest robustness to noise, referred to as a most robust coding level, being decoded first.

32. A method of receiving a signal modulated according to a multi-level coding technique comprising at least two coding levels each having a distinct robustness to noise, said signal comprising a plurality of symbols ($S_r$) each comprising at least one bit, assigned to one of said coding levels, said method comprising:
performing at least two successive decoding iterations with a decoder, each iteration comprising successive steps of decoding each of said at least one bit, at least one of said successive steps of decoding taking into account the result of at least one possible preceding step of decoding;
determining the robustness to noise of said coding levels, the robustness to noise of a coding level being inversely proportional to the error rate of said coding level; and
determining a decoding order according to the robustness to noise of said coding levels, wherein the steps of performing at least two decoding iterations, determining the robustness to noise of said coding levels, and determining the decoding order are performed within at least one of the following fields:
digital radio transmissions, in particular of the DRM (Digital Radio Mondiale) type;
error correction codes;
digital signal processing;
digital communications;
recording/restoration of a digital signal,
wherein, during said decoding iterations, said bits are decoded according to said decoding order taking into account the robustness to noise of said coding levels, the bit or bits assigned to the coding level having a greatest robustness to noise, referred to as a most robust coding level, being decoded first.

* * * * *

UNITED STATES PATENT AND TRADEMARK OFFICE
CERTIFICATE OF CORRECTION

PATENT NO.        : 7,609,787 B2
APPLICATION NO.   : 10/529570
DATED             : October 27, 2009
INVENTOR(S)       : Jahan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1034 days.

Signed and Sealed this

Twelfth Day of October, 2010

David J. Kappos
*Director of the United States Patent and Trademark Office*